United States Patent
Wu et al.

(10) Patent No.: US 6,221,495 B1
(45) Date of Patent: Apr. 24, 2001

(54) THIN TRANSPARENT CONDUCTING FILMS OF CADMIUM STANNATE

(75) Inventors: Xuanzhi Wu, Golden; Timothy J. Coutts, Lakewood, both of CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 08/740,347

(22) Filed: Nov. 7, 1996

(51) Int. Cl.$^7$ ............................................ B32B 15/00
(52) U.S. Cl. .............. 428/432; 204/192.12; 204/192.15; 427/314; 427/343; 427/419.2; 427/419.3; 427/532
(58) Field of Search ................. 428/432; 204/192.12, 204/192.15; 427/532, 314, 343, 419.2, 419.3

(56) References Cited

PUBLICATIONS

G. Haacke,"Exploratory Development of Transparent Conductor Materials," Air Force Materials Laboratory Technical Report No. AFML–TR–75–21, Mar. 1975, 57 pp.

G. Haacke, W.E. Mealmaker, and L.A. Siegel, "Sputter Deposition and Characterization of $Cd^2SnO^4$ Films," Thin Solid Films, vol. 55 (1978), pp. 67–81.

L. C. Burton and G. Haacke, "A New Type of $Cu^2CdS$ Backwall Solar Cell," Record of the Tenth Intersociety Energy Conversion Engineering Conference, Institute of Electrical and Electronics Engineers, Inc. and IECEC Steering Committee, IEEE Catalog No. 75CHO 983–7 TAB, Aug. 18–22, 1975, pp. 396–399.

G. Haacke, "Cadmium Stannate Selective Optical Films for Solar Energy Applications," Proceedings of the First ERDA Semiannual Solar Voltaic Conversion Program Conference, University of California, Los Angeles, California, Jul. 22–25, 1975, Jet Propulsion Laboratory Document No. 5040–13, pp. 661–676.

L.C. Burton, T. Hench, G. Storti, and G. Haacke, "$CdS–Cu^2S$ Solar Cells Fabricated on $Cd^2SnO^4$–Silica Substrates," Journal of the Electrochemical Society: Solid–State Science and Technology, vol. 123, No. 11 (Nov., 1976), pp. 1741–1744.

R.P. Howson and M.I. Ridge, "Deposition of Transparent Heat–Reflecting Coatings of Metal Oxides Using Reactive Planar Magnetron Sputtering of a Metal and/or Alloy," Thin Solid Films, vol. 77 (1981), pp. 119–125.

P. Lloyd, "Properties of Cadmium Stannate Films Prepared by R.F. Sputtering from Powder Targets," Thin Solid Films, vol. 41, (1977), pp. 113–120.

J.M. Blackmore and A.F. Cattell, "Properties of Two–Phase Cadmium Stannate Thin Films," Thin Solid Films, vol. 185, (1990), 97–110.

P. Dongliang, J. Shengrui, and W. Wanlu, "Effect of Heat Treatment on Electrical and Optical Properties of $Cd^2SnO^4$ Films," Chinese Phys. Lett., vol. 10, No. 3 (1993), pp. 189–192.

E. Leja, K. Budzyńska, T. Pisarkiewicz, and T. Stapiński, "$Cd^2SnO^4$ Thin Films Obtained by D.C. Reactive Sputtering of CD–Sn Alloys," Thin Solid Films, vol. 100 (1983), pp. 203–208.

T. Pisarkiewicz, K. Zakrzewska, and E. Leja, "Preparation, Electrical Properties and Optical Characterization of $Cd^2SnO^4$ and $CdIn^2O^4$ Thin Films as Transparent and Conductive Coatings," Thin Solid Films, vol. 153 (1987), 479–486.

H. Enoki, T. Satoh, and J. Echigoya, "$CdO–SnO^2$ Thin Films Prepared by DC Sputtering with Oxide Targets," Phys. Stat. Sol. (a), vol. 126 (1991), pp. 163–170.

N. Miyata and K. Miyake, Transparent Electrode Properties of Cd–Sn Oxide Films by D.C. Reactive Sputtering, Surface Science, vol. 86 (1979), pp. 384–388.

N. Miyata, K. Miyake, and S. Nao, "Physical Properties of Cadmium–Tin Oxide Films Deposited by D.C. Reactive Sputtering," Thin Solid Films, vol. 58 (1979), pp. 385–389.

N. Miyata, K. Miyake, T. Fukushima, and K. Koga, "Cadmium–Tin Oxide Films Deposited by rf Sputtering from a $CdO–SnO^2$ Target," Applied Physics Letters, vol. 35, No. 7 (Oct. 1, 1979), pp. 542–543.

M.T. Mohammed and W.A.S. Abdul Ghafor, "Optical Properties of Cadmium Stannate Thin Film Prepared by Pyrolytic Process," Solid State Comm., vol. 72, No. 10 (1989), pp. 1043–1046.

M.T. Mohammed and W.A.S. Abdul Ghafor, "Cadmium Stannate Thin Film as a Solar Energy Utilizing Element," Solid State Comm., vol. 88, No. 3 (1993), pp. 227–230.

A.J. Nozik, "Optical and Electrical Properties of $Cd^2SnO^4$: A Defect Semiconductor," Physical Review B, vol. 6, No. 2 (Jul.15, 1972), pp. 453–459.

T.L. Chu, S.S. Chu, N. Schultz, C. Wang, and C.Q. Wu, "Solution–Grown Cadmium Sulfide Films for Photovoltaic Devices," Journal of the Electrochemical Society, vol. 139, No. 9 (Sep., 1992), pp. 2443–2446.

Primary Examiner—Melvyn I. Marquis
(74) Attorney, Agent, or Firm—Ken Richardson

(57) ABSTRACT

A process for preparing thin $Cd_2SnO_4$ films. The process comprises the steps of RF sputter coating a $Cd_2SnO_4$ layer onto a first substrate; coating a second substrate with a CdS layer; contacting the $Cd_2SnO_4$ layer with the CdS layer in a water- and oxygen-free environment and heating the first and second substrates and the $Cd_2SnO_4$ and CdS layers to a temperature sufficient to induce crystallization of the $Cd_2SnO_4$ layer into a uniform single-phase spinel-type structure, for a time sufficient to allow full crystallization of the $Cd_2SnO_4$ layer at that temperature; cooling the first and second substrates to room temperature; and separating the first and second substrates and layers from each other. The process can be conducted at temperatures less than 600° C., allowing the use of inexpensive soda lime glass substrates.

21 Claims, 7 Drawing Sheets

THIN TRANSPARENT CONDUCTING FILMS OF CADMIUM STANNATE

The United States Government has rights in this invention under Contract No. DE-AC36-83CH10093 between the United States Department of Energy and the National Renewable Energy Laboratory, a division of Midwest Research Institute.

BACKGROUND OF THE INVENTION

1. Field of the Invention

The present invention is related generally to thin transparent conducting oxide films and more particularly to thin transparent conducting films of cadmium stannate.

2. Description of Related Art

Transparent conductive oxides (TCOs) are a family of wide band-gap semiconductors which can be doped to relatively high levels and fabricated into thin films exhibiting both good light transmittance and reasonable electrical conductivity. The fundamental absorption edge of TCOs generally lies at about 0.35 $\mu$m. Thus, the TCOs transmit light relatively well in a range defined by the short wavelength transition to high absorption and the long wavelength transition to high reflection. TCO layers have been used in applications such as solar cells, heat mirrors, electrochromic windows, and flat panel displays.

Commercially useful TCOs for applications such as flat panel displays have sheet resistances around 20 ohm/square, mobilities around 20–30 $cm^2V^{-1}s^{-1}$, and optical transmission of 80–85% over a relatively wide range of visible wavelengths. Coatings useful for architectural purposes, such as heat-reflecting windows, should have high optical transmission throughout the visible light range, but also should exhibit an abrupt decrease in transmission and increase in reflectance at longer infrared wavelengths (1–1.5 $\mu$m) to reduce heat-loss effects. For many applications, it would be desirable to obtain sheet resistances as low as 2–5 ohm/sq. and optical transmittances greater than 85 per cent.

TCOs suitable for commercial use must also be easy to produce, durable, smooth, and easy to pattern or etch. Tin oxide ($SnO_2$) films have been used in commercial TCO applications. However, $SnO_2$ is difficult to etch chemically to produce desired patterns. In contrast, $Cd_2SnO_4$ can be etched easily in hydrochloric acid or hydrofluoric acid.

In 1972, A. J. Nozik reported in *Phys. Rev., Sect. B*, 6, p. 453, that spinel structured cadmium stannate ($Cd_2SnO_4$, or CTO) had an unusually high Hall effect electron mobility. Further investigation by G. Haacke and his coworkers led to development of CTO films such as those described in a report entitled, "Exploratory Development of Transparent Conductor Materials," by G. Haacke, prepared for the Air Force Materials Laboratory in March, 1975, No. AD-A008 783. He found that radio frequency (RF) sputtering onto silica and glass substrates resulted in coatings superior to those deposited by chemical spray or vacuum evaporation or onto other substrates. The deposited films were amorphous unless crystallization was induced by maintaining the substrate at elevated temperature during the sputtering process. Lower substrate temperatures were possible when the sputtering was conducted in pure oxygen than when a combination of oxygen and argon was used. However, glass and silica substrates were heated to temperatures of at least 500° C. during the sputtering operation. Haacke also found that intrinsic dopants, such as interstitial cadmium or oxygen vacancies, increased the film electrical conductivity. Haacke reported CTO films having sheet resistances near 1.5 ohm/square and better than 85% visible transmission when corrected for absorption in the substrate. Film conductivity was maximized by a post-deposition heat treatment for 10 minutes at 650° C. in argon. Haacke's sputtered CTO films contained CdO and $CdSnO_3$ phases in addition to $Cd_2SnO_4$, and the presence of these additional phases reduced free electron mobilities to values less than those observed for amorphous coatings.

For many uses of CTO films, it is desirable to form the film on an inexpensive substrate, such as soda-lime glass. However, soda-lime glass cannot withstand the temperatures required in Haacke's process. Haacke reported that soda-lime glass substrates acquired internal stresses when annealed at 650° C., but could be treated by gradually raising the temperature from 400° C. to 580° C. The resulting films on soda lime glass substrates had 20% lower conductivities than films deposited on other substrates. Haacke stated that electrical sheet resistances in the 5–10 ohm/square were sought, but did not report any electrical properties for soda lime glass samples. Other workers modified the deposition and/or heat treating steps to improve CTO film properties.

Methods developed to date for making high-conductivity, optically transparent CTO films generally comprise two high temperature steps: sputtering and subsequent heat treating. In commercial operations, each high temperature step lengthens the overall production time by adding a cooling period to the process and also increases the energy requirements for the process, thereby increasing costs.

The optical and electrical properties of CTO films produced by Haacke's method can be improved by covering the films with a layer of CdS powder and then heating the films to about 700° C. in an argon atmosphere. However, there are several significant disadvantages with using CdS powder in the CdS/Ar annealing step in the production of CTO films. First, it is difficult to achieve a uniform coating of CdS powder, and therefore also difficult to obtain high quality uniform films after annealing. Second, water and oxygen, inevitably present in the CdS powder, cause stains to develop in CTO films, and it is difficult to maintain the CdS powder, with its relatively large surface area, free of adsorbed water and oxygen. Finally, CdS is toxic and subject to stringent environmental regulations with respect to handling and disposal. The furnace and work area can easily become contaminated with CdS powder, posing a significant environmental hazard.

Thus, there is a need for CTO films with improved optical and electrical properties. There is a further need to obtain uniform, stain-free CTO films. Yet another need is for a method of forming CTO films which minimizes the number of steps which must be conducted at high temperature. A further need is for a method of forming CTO films without subjecting the substrate to high temperatures above 600° C. There is a still further need for a method for forming CTO films with a reduced likelihood of CdS contamination of the work area.

Thus, it is an object of the present invention to provide CTO films formed by a method which results in improved optical and electrical properties of the film.

It is a further object of the present invention to provide a method for forming uniform, stain-free CTO coatings.

It is yet another object of the present invention to provide a method of forming CTO films which decreases the number of steps which must be conducted at high temperature.

It is a yet further object of the present invention to provide a method of forming CTO films without subjecting the substrate to temperatures greater than about 600° C.

It is a still further object of the present invention to provide a method for forming CTO films with a reduced likelihood of CdS contamination of the work area.

SUMMARY OF THE INVENTION

To achieve the foregoing and other objects and in accordance with the purpose of the present invention broadly described herein, one embodiment of this invention comprises a process for preparing $Cd_2SnO_4$ films. In the process, a layer of $Cd_2SnO_4$ is RF sputter coated onto a first substrate, and a second substrate is coated with a layer of CdS. The $Cd_2SnO_4$ layer and the CdS layer are placed in physical contact with each other in an environment essentially free of water and oxygen. The first and second substrates and the $Cd_2SnO_4$ and CdS layers are heated to a treatment temperature sufficient to induce crystallization of the $Cd_2SnO_4$ layer into a uniform single-phase spinel structure, for a time sufficient to allow full crystallization of the $Cd_2SnO_4$ layer at that temperature. The substrates are cooled to room temperature, and the first substrate with the crystalline $Cd_2SnO_4$ layer is removed from the second substrate and CdS layer. The treatment temperature can be less than 600° C.

Another embodiment of this invention comprises a $Cd_2SnO_4$ film prepared by a process in which a layer of $Cd_2SnO_4$ is RF sputter coated onto a first substrate, and a second substrate is coated with a layer of CdS. The $Cd_2SnO_4$ layer and the CdS layer are placed in physical contact with each other in an environment essentially free of water and oxygen. The first and second substrates and the $Cd_2SnO_4$ and CdS layers are heated to a treatment temperature sufficient to induce crystallization of the $Cd_2SnO_4$ layer into a uniform single-phase spinel structure, for a time sufficient to allow full crystallization of the $Cd_2SnO_4$ layer at that temperature. The first substrate and crystalline $Cd_2SnO_4$ layer and the second substrate and CdS layer are cooled to room temperature and removed from each other. The temperature can be less than 600° C., and the first substrate can comprise soda lime glass.

BRIEF DESCRIPTION OF THE DRAWINGS

These and other features, aspects, and advantages of the present invention will become better understood with reference to the following description, appended claims, and accompanying drawings, where:

DETAILED DESCRIPTION OF THE INVENTION

Figure 1:
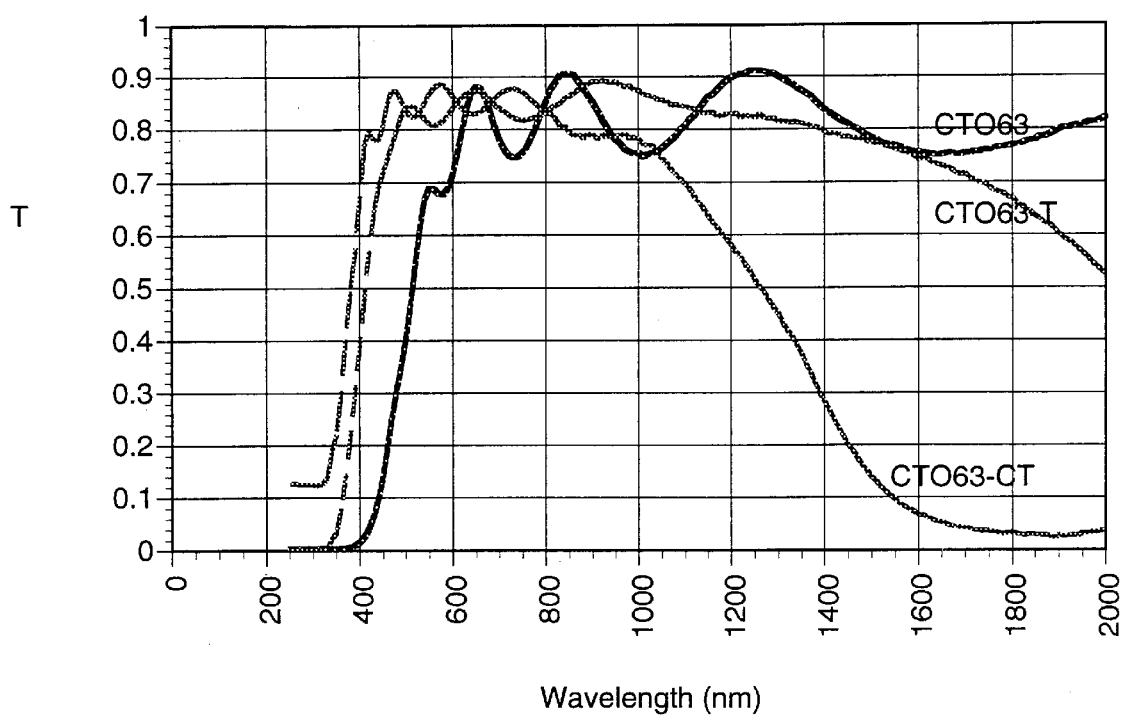
FIG. 1 is a graph of transmittance versus wavelength for an as-grown CTO film formed by RF sputtering onto a Corning 7059 glass substrates, a CTO film formed by RF sputtering and then heat treatment in pure argon, and a CTO film formed by the method of the present invention.

One embodiment of the present invention comprises a method for preparing thin transparent conducting oxide films by RF sputtering a layer of substantially amorphous $Cd_2SnO_4$ (CTO) onto a suitable substrate. A layer of CdS is formed on a separate substrate, such as soda lime glass, by a suitable technique, such as RF sputtering or chemical bath deposition. The coated CdS layer is placed in contact with the $Cd_2SnO_4$ layer and heated to a treatment temperature sufficient to induce crystallization of the CTO layer. The two substrates are then cooled and removed from each other. The resulting uniform, crystalline CTO film has significantly improved electrical and optical properties when compared to the properties of previously available CTO films.

As is apparent to one skilled in the art, the substrate for the CTO layer (henceforth "first substrate") must be optically transparent over the range of light wavelengths for which transmission through the substrate is desired. Suitable first substrates allowing transmission of visible light include silica and glass. Also, the first substrate must be of a material capable of withstanding heat treatment at temperatures of 580° C. or more, as described below, and the CTO layer must adhere to the first substrate material. The thermal expansion coefficient of the first substrate must be close enough to the thermal expansion coefficient of the CTO layer to prevent cracking or buckling of the CTO layer during heat treatment.

In accordance with the present invention, a CTO film is created by RF sputtering from a hot-pressed target containing stoichiometric amounts of $SnO_2$ and CdO onto the first substrate. The sputtering can be conducted in substantially pure oxygen which is substantially free of impurities which could react with the metal oxides present. Preferably, the oxygen is 99.999% pure. It is also preferred that the sputtering is at room temperature. As deposited by RF sputtering, the CTO layer is yellowish in color and substantially amorphous. As is apparent to one skilled in the art, higher transmittance is obtained with a thinner film, and lower sheet resistivity is obtained with a thicker film. Films prepared by the method of the present invention and having thicknesses of about 0.5 microns were found to have desirable optical and electrical properties.

The CdS layer may be formed on a second substrate by any method known to those skilled in the art. For example, the CdS layer may be formed by chemical bath deposition or sputtering. Although there is no maximum layer thickness, the coating should be thick enough for reuse. The CdS layer must also have a smooth surface and be uniform and free of pinholes.

The second substrate may be any material known to those skilled in the art which is capable of withstanding heat treatment at temperatures up to 600° C. or more. The material must be one to which CdS will adhere. Also, the coated substrate must have a CdS layer surface which is sufficiently flat to make good contact with CTO layer, as described below. Further, the substrate must not react chemically with CdS at the treatment temperature. A suitable, inexpensive substrate is soda lime glass.

The CTO and CdS layers are then placed in contact with each other in an environment substantially free of water and oxygen. Water and oxygen cause stains in the CTO film which inhibit its optical and electrical properties. In this method, a suitable environment is flowing argon at ambient pressure. The substrates and layers are then heated for a period of time sufficient for the CTO layer to form a uniform single-phase layer of $Cd_2SnO_4$ with a spinel crystal structure, substantially free of CdO and $CdSnO_3$ phases. The treatment temperature should be low enough to prevent softening and damage to the first substrate. Although higher treatment temperatures result in superior $Cd_2SnO_4$ film properties, satisfactory films have been obtained at temperatures less than 600° C. Twenty minutes was found to be a satisfactory period for treatment in laboratory experiments.

After the heat treatment, the two substrates are cooled at a rate slow enough to avoid stress in the substrates and removed from each other. The second substrate with its CdS layer may be reused until the CdS layer is too thin to perform properly. The second substrate may then be recoated with a new layer of CdS and reused.

It is believed that during the heat treatment, CdS vapor is sublimated from the CdS layer and diffuses into the CTO crystal lattice, creating interstitial Cd and oxygen vacancies and reducing the quantity of secondary phases present. X-ray diffraction data obtained for treated samples indicate a single spinel crystal structure having a slightly larger lattice constant than CTO without interstitial cadmium Heat-treated coatings exhibit markedly improved optical and electrical properties relative to untreated coatings.

The method for forming films as described is advantageous for several reasons. As discussed above, it is important to keep water and oxygen away from the CdS and CTO layers during the heat treatment step. It is much easier to keep these contaminants out of a thin layer of CdS than out of a quantity of powdered material, as taught by Haacke. By using a CdS-coated substrate, the difficulties and hazards associated with handling CdS are significantly reduced. The CTO film formed by the method of this invention exhibits high stability at elevated temperature and over long time periods.

The method of the present invention is also economically advantageous. High quality films have been prepared on soda lime glass substrates, allowing low-cost applications. There is only one high temperature step, which decreases the time and energy requirements for preparation of the CTO films and may be a significant factor in commercial production of films. Further, less CdS is used than in prior art methods because only a thin coating is needed, there is less waste due to loss of CdS powder in the lab environment, and there is less risk of exposure to CdS during handling because the CdS is not in powdered form. The CdS layer and the substrate on which it is deposited are reusable.

Films prepared by the method of the present invention can be used in a variety of applications. RF sputtering, as is done for the CTO layer and can be done for the CdS layer, is a method suitable for coating large substrate areas. Using an inexpensive substrate, such as soda lime glass, significantly reduces the cost of a coated sheet. Thus, the method of the present invention can be used to prepare relatively large coated sheets economically.

Table I compares the thicknesses and electrical properties of several commercially available $SnO_2$ films, a film described by G. Haacke, and films described in the following Examples 1–3. In the table, $R_s$ is the sheet resistivity, $\mu$ is electron mobility, n is the charge carrier concentration, and $\rho$ is the resistivity. All values reported in Table I were obtained in the same laboratory using the same equipment and analytical techniques except the data of Haacke, et al., which are presented as reported by Haacke.

TABLE I

| Sample Number and Description | Thickness ($\mu$m) | $R_s$ ($\Omega$-sq$^{-1}$) | $\mu$ (cm$^2$V$^{-1}$s$^{-1}$) | n (cm$^{-3}$) | p ($\Omega$-cm) |
|---|---|---|---|---|---|
| 580-PPG (Prior art) $SnO_2$, obtained from PPG Industries, Inc., Glass Technology Center, P.O. Box 11472, Guys Rum Road, Harmarville, Pennsylvania, USA | 0.3423 | 18.0 | 25.0 | $4.20 \times 10^{20}$ | $5.88 \times 10^{-4}$ |
| 26-LOF (Prior art) $SnO_2$, obtained from LOF Company, Libby Owens Ford, 811 Madison Ave., P.O. Box 799, Toledo, Ohio, USA | 0.3378 | 13.4 | 33.0 | $4.19 \times 10^{20}$ | $4.53 \times 10^{-4}$ |
| Haacke et al. (Prior art) Thin solid Films, Vol. 55 (1978), pp.67–81. $Cd_2SnO_4$, sputtered onto Corning 7059 glass at 650° C., heat treated at 650° C. in $O_2$, heat treated at 650° C. in Ar/CdS. | 1.3000 | 2 | 40 | $4 \times 10^{20}$ | $1.5$–$1.8 \times 10^{-4}$ |
| CTO63-CT $Cd_2SnO_4$ on Corning 7059 glass, sputtered at room temperature, heat treated at 680° C. in Ar/CdS. | 0.5100 | 2.5 | 54.5 | $8.94 \times 10^{20}$ | $1.28 \times 10^{-4}$ |
| CTO48-8T $Cd_2SnO_4$ on Corning 7059 glass, sputtered at room temperature, heat treated at 580° C. in Ar, no CdS. | 0.4300 | 26.4 | 33.3 | $2.02 \times 10^{20}$ | $9.29 \times 10^{-4}$ |
| CTO66-2CT $Cd_2SnO_4$ on Corning 7059 glass, sputtered at room temperature, heat treated at 580° C. in Ar/CdS. | 0.6300 | 3.6 | 43.4 | $6.19 \times 10^{20}$ | $2.33 \times 10^{-4}$ |
| CTO79-3CT $Cd_2SnO_4$ on soda lime glass, sputtered at room temperature, heat treated at 600° C. in Ar/CdS. | 0.5500 | 3.2 | 51.6 | $6.58 \times 10^{20}$ | $1.84 \times 10^{-4}$ |

The following examples demonstrate the practice and utility of the present invention but are not to be construed as limiting the scope thereof. Any suitable laboratory equipment known to those skilled in the art can be utilized to form films and measure film properties. In the examples, $Cd_2SnO_4$ layers are deposited onto substrates using a modified SC-300 evaporation system, manufactured by CVC Products. Optical measurements are made with a Cary 2300 spectrophotometer, manufactured by Varian Company.

EXAMPLE 1

Thin films of $Cd_2SnO_4$ are deposited on Corning 7059 glass wafers and silicon wafers by RF sputtering at room temperature in pure oxygen in a modified SC3000 evaporation system maunfactured by CVC Products, Inc. The targets comprise 67 mol % CdO and 33 mol % $SnO_2$ which have reacted chemically at high temperature and pressure to form sintered targets of orthorhombic $Cd_2SnO_4$. The separation between the target and the substrate is 6 cm, and the RF power is between 100 and 140 Watts. The oxygen pressure is maintained at 10–20 mTorr. The average deposition rate is about 10 nm min$^{-1}$.

Samples CTO63-T and CTO63-CT are heated at 680° C. for about 20 minutes in a tube furnace containing argon of 99.999% purity flowing at a rate of 1500 sccm. Sample CTO63-CT is placed in contact with a CdS-coated glass substrate during the heat treatment. The CdS has previously been deposited by chemical bath deposition as a thin layer on a glass substrate. The resulting films are about 0.51 microns thick. Sample CTO63-T has an uneven yellowish color, and sample CTO63-CT appears uniform and transparent with a pale green tint.

FIG. 1 compares the optical transmittance (T) for an as-grown sample without heat treatment (CTO63), the argon heat treated sample (CTO63-T), and the sample which was heat-treated in argon in contact with the CdS layer (CTO63-CT). Compared to samples CTO63 and CTO63-T, sample CTO63-CT has a higher average transmittance (about 85 per cent) over the visible portion of the spectrum, a large shift of the transmittance edge to shorter wavelengths, and an abrupt decrease in transmittance at wavelengths above about 1050 nm.

Figure 2:
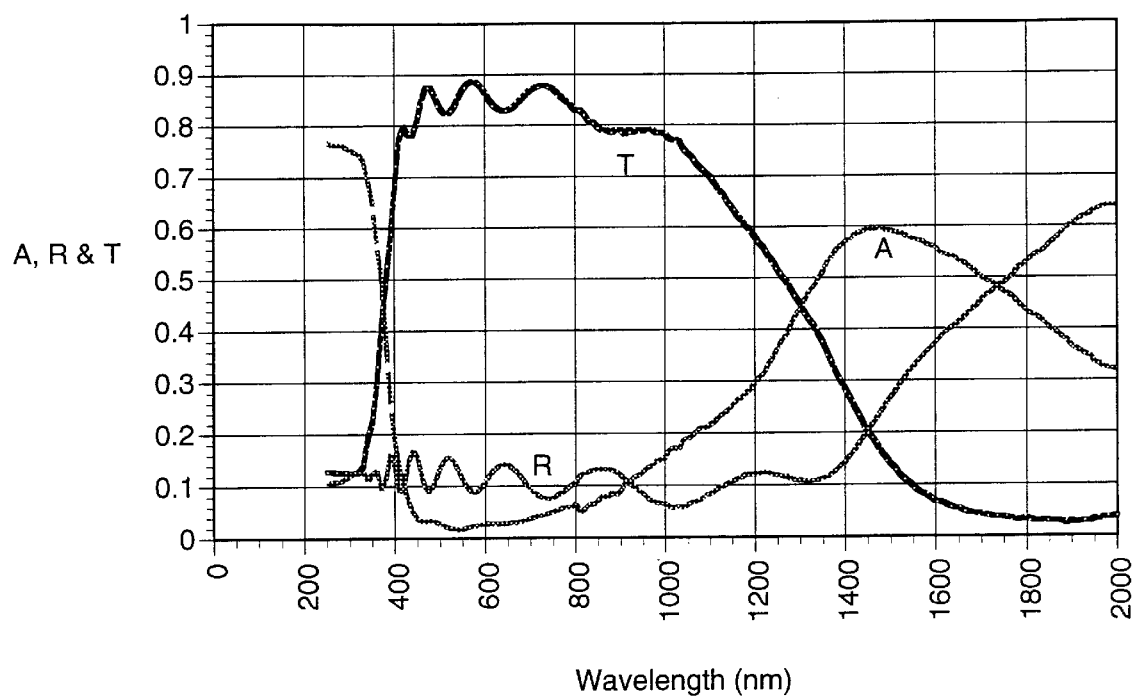
FIG. 2 is a graph of absorbance, reflectance, and transmittance for the same CTO film shown in FIG. 1 and formed by the method of the present invention.

FIG. 2 shows the absorbance (A), reflectance (R), and transmittance (T) of sample CTO63-CT. In the infrared region above about 1600 nm, the transmittance is very low and the reflectance is high, indicating that the coating would be suitable for applications, such as architectural installations, in which it is desirable to limit infrared penetration of the coated substrate.

As shown in Table I, sample CTO63-CT has a lower resistivity (ρ) and higher mobility (μ) and carrier density (n) than the commercially available samples of comparable thickness.

EXAMPLE 2

Films of $Cd_2SnO_4$ are RF sputtered onto Corning 7059 glass substrates as described in Example 1. Four portions of sample CTO45 are heat treated for 20 minutes in flowing argon at 500° C., 580° C., 600° C., and 680° C., respectively. Sample CT66-2CT heat treated for 20 minutes in flowing argon in contact with a CdS layer at 580° C. The CdS layer is prepared by chemical bath deposition.

Figure 3:
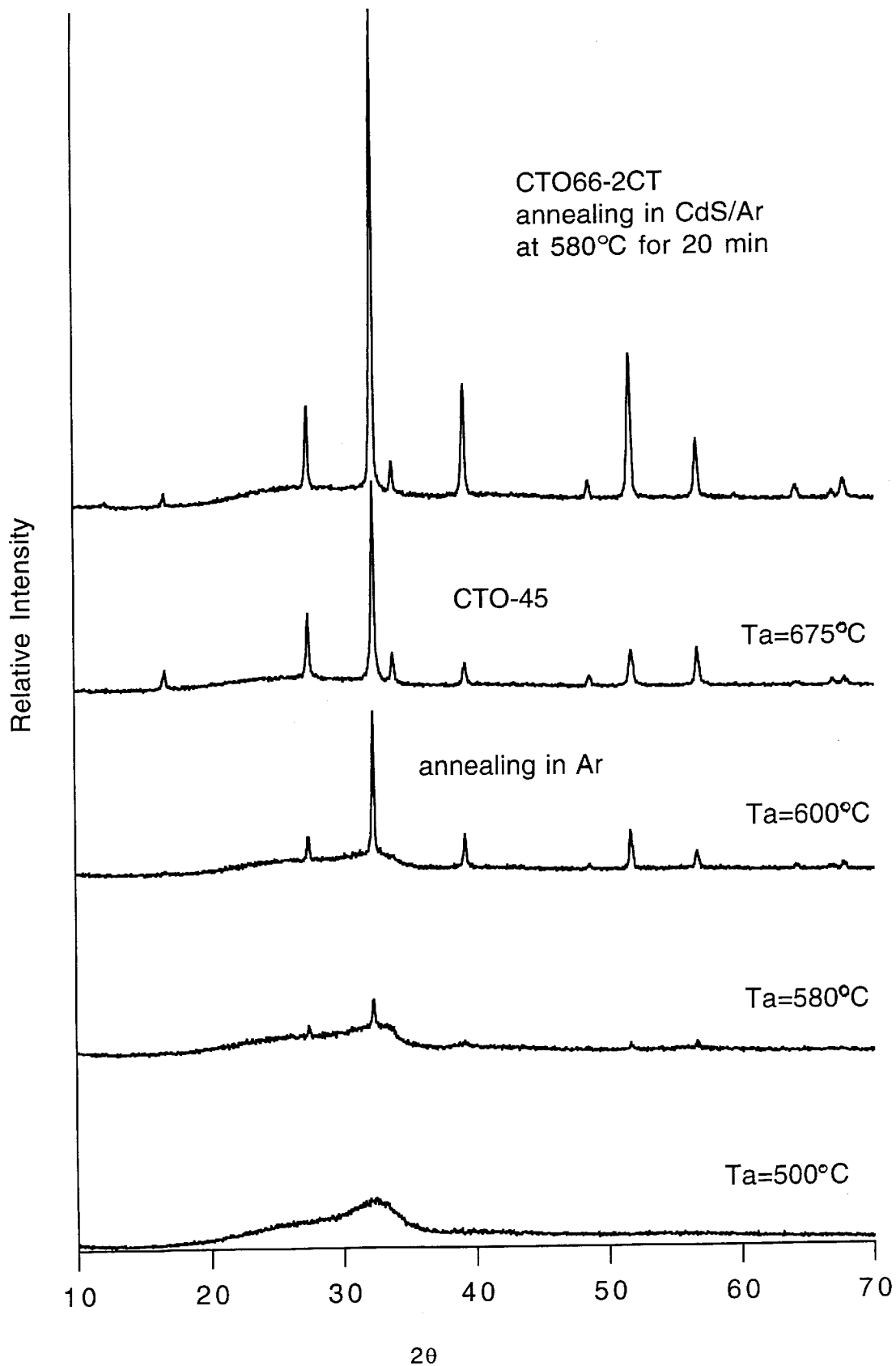
FIG. 3 is a graph showing the relative intensities of x-ray diffraction peaks as a function of 2 theta for CTO films heat treated at different temperatures, with and without being contacted by a layer of CdS during heat treatment.

FIG. 3 compares x-ray diffraction patterns obtained with a DMAX-A x-ray diffractometer, manufactured by Rigaku Company. The pattern of sample CTO45, annealed in pure argon at 580° C., shows an amorphous structure. In contrast, the diffraction pattern of sample CTO66-2CT, heat treated at 580° C. in contact with CdS, indicates a well-developed spinel crystal structure, superior to that indicated by the diffraction pattern of sample CTO45, heat treated at 675° C.

Figure 4:
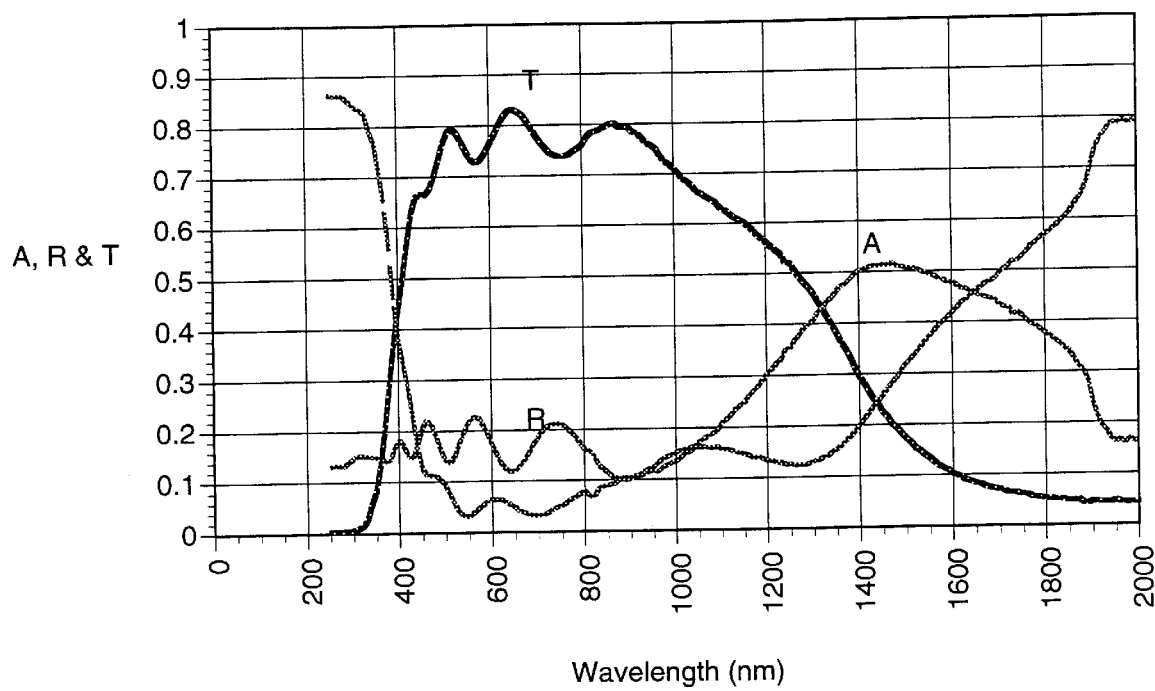
FIG. 4 is a graph of absorbance, reflectance, and transmittance for the CTO film shown in FIG. 3 which was heat treated at 580° C. in contact with CdS.

FIG. 4 shows the absorbance (A), reflectance (R), and transmittance (T), spectra of sample CTO66-2CT, which was heat treated in contact with the CdS layer at 580° C. The curve shapes are similar to those shown in FIG. 2 for sample CTO63-CT, which was treated at 680° C., with slightly decreased transmittance through the visible region, and lower absorbance and reflectance in the infrared region. The rapid decreases in transmittance at wavelengths greater than about 1000 nm observed in samples CTO63-CT and CTO66-2CT result from the high Hall mobility and carrier concentrations of these samples.

As indicated in Table I, sample CTO48-8T, heat treated in argon at 580° C., has electrical properties which are less desirable than the commercial sample properties. In contrast, sample CTO66-2CT has electrical properties much superior to those of the commercial samples and almost as desirable as those of the sample CTO63-CT, treated at 680° C. in contact with CdS.

Thus, contacting the CTO layer with a CdS layer allows the production of a film with superior structure and optical and electrical properties at a significantly lower treatment temperature than without the CdS layer.

EXAMPLE 3

Figure 5:
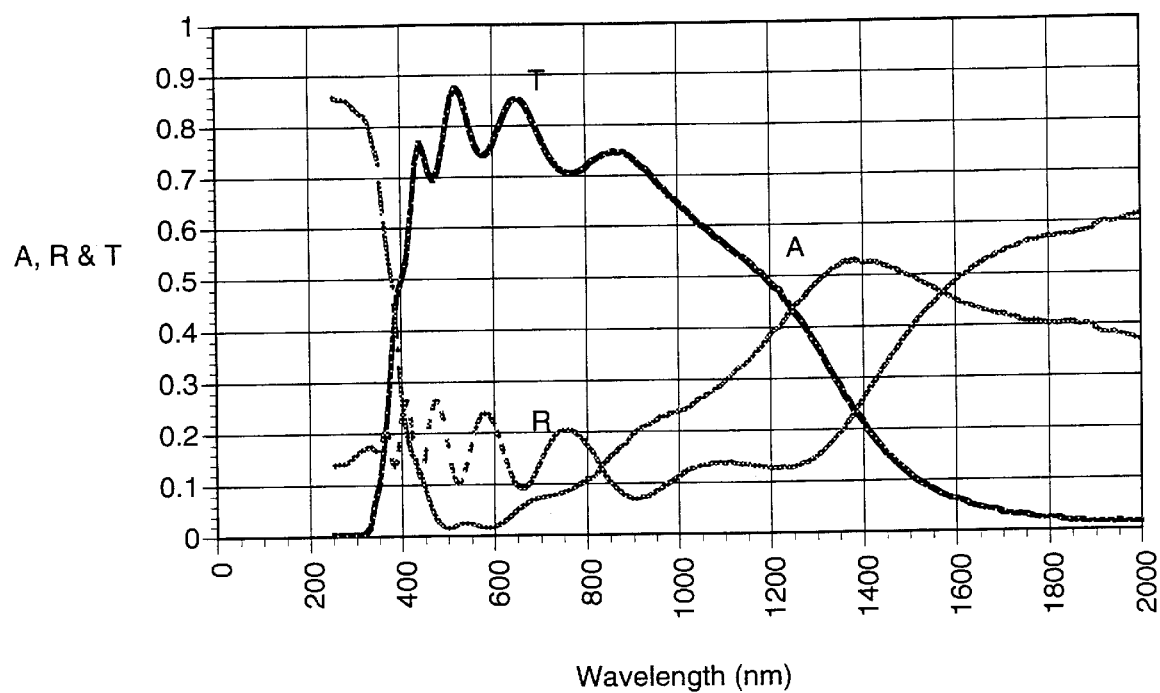
FIG. 5 is a graph of absorbance, reflectance, and transmittance of a CTO sample prepared by the method of the present invention on a soda lime glass substrate and heat treated at 580° C. in contact with CdS.

$Cd2SnO_4$ film sample CTO79-3CT is prepared as described in Example 1 except that the film is RF sputtered onto a soda lime glass substrate and heat treated in contact with a layer of CdS at a temperature between 580° C. and 600° C. The soda lime glass substrate is not damaged or softened by the heat treatment. As shown in FIG. 5, the absorbance (A), reflectance (R), and transmittance (T) spectra of sample CTO79-3CT are comparable to those shown in FIG. 4 for sample CTO66-2CT, similarly prepared on a high-temperature glass substrate. The electrical properties of sample CTO79-3CT are also presented in Table I. Thus, it can be seen that a $Cd_2SnO_4$ film can be prepared by RF sputtering onto a relatively inexpensive soda lime glass substrate and then heat treating the film at a temperature less than about 600° C. in contact with a layer of CdS in flowing argon. The resulting film has optical and electrical properties superior to those of previously described films.

EXAMPLE 4

Figure 6:
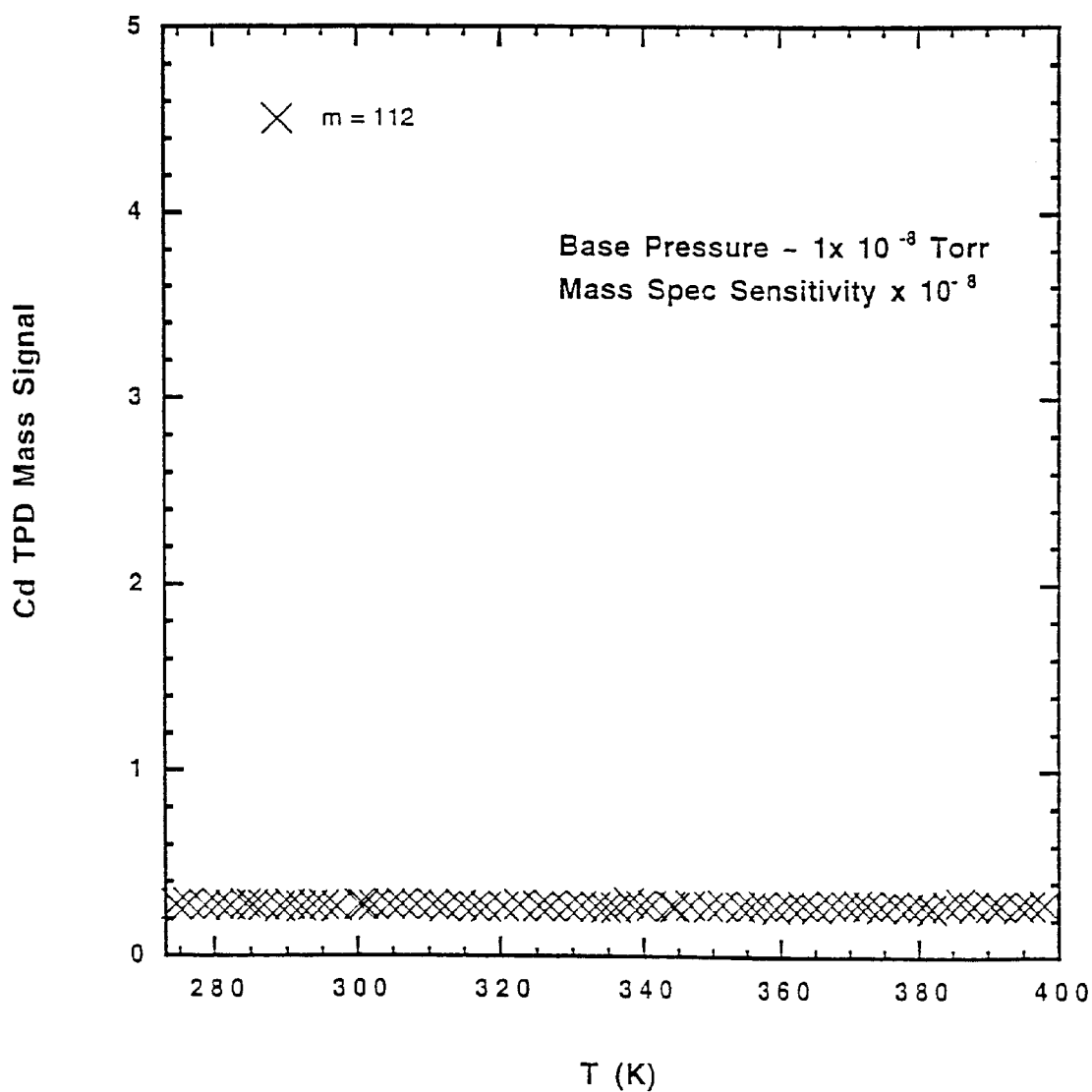
FIG. 6 is a graph of cadmium TPD mass signal as a function temperature for a CTO sample prepared by the method of the present invention.

A film of $Cd_2SnO_4$ is prepared as described in Example 1 and subjected to a residual gas analysis to determine the temperature stability of the film with respect to release of Cd. The sample is heated to 400K at a pressure $10^{-5}$ Torr in a UTI 100C Precision Gas Analyzer, manufactured by Uthe Technology International. As shown in FIG. 6, no cadmium-containing gaseous species are detected, up to the detection limit of about $10^{-8}$ atomic per cent. Thus, the CTO film is stable and does not decompose readily at elevated temperatures such as those likely to be encountered in most uses of CTO films.

EXAMPLE 5

Figure 7:
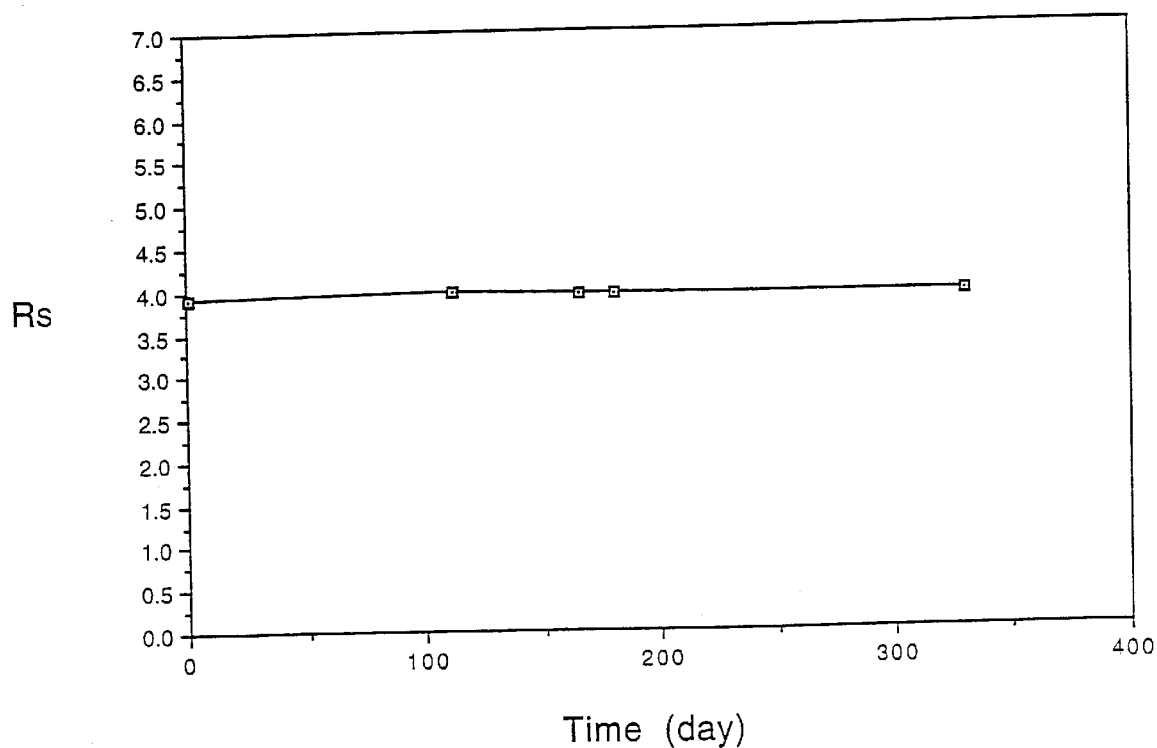
FIG. 7 is a graph of sheet resistivity as a function of time for a CTO sample prepared by the method of the present invention.

A film of $Cd_2SnO_4$ is prepared as described in Example 1 and heat treated in contact with a layer of CdS at 680° C. The film is stored at room temperature, and the sheet resistance of the film is measured periodically during the year. As indicated in FIG. 7, no change in sheet resistivity (Rs, shown in Ω/square) is observed, indicating that the CTO film properties are stable over extended periods of time.

The foregoing description is considered as illustrative only of the principles of the invention. Further, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims which follow.

We claim:

1. A process for preparing a $Cd_2SnO_4$ film, the process comprising the steps of:

(a) radio frequency sputter coating a substantially amorphous $Cd_2SnO_4$ layer onto a first substrate from a target source having stoichiometric amounts of $SnO_2$ and CdO;

(b) depositing a CdS layer on a second substrate using a CdS layer coating means;

(c) contacting the $Cd_2SnO_4$ layer with the CdS layer in an environment essentially free of water and oxygen;

(d) heating the first and second substrates and the $Cd_2SnO_4$ and CdS layers to a treatment temperature sufficient to induce crystallization of the $Cd_2SnO_4$ layer into a uniform single-phase spinel structure, for a time sufficient to allow full crystallization of the $Cd_2SnO_4$ layer at the treatment temperature;

(e) cooling the first and second substrates to room temperature; and (f) separating the first substrate having the crystallized $Cd_2SnO_4$ film from the second substrate and the CdS layer.

2. The process of claim 1 wherein said substantially amorphous $Cd_2SnO_4$ layer is sputter coated onto said first substrate at room temperature.

3. The process of claim 1 wherein said substantially amorphous $Cd_2SnO_4$ layer is RF sputtered onto said first substrate in an atmosphere consisting essentially of oxygen.

4. The process of claim 1 wherein said treatment temperature is less than about 600° C.

5. The process of claim 1 wherein said CdS layer is sputter coated onto said second substrate.

6. The process of claim 1 wherein said CdS layer is deposited onto said second substrate by chemical bath deposition or sputtering.

7. The process of claim 1 wherein said second substrate and said CdS layer are reused with a new first substrate and $Cd_2SnO_4$ layer.

8. The process of claim 1 further comprising:

(a) after separating the first substrate having the crystallized $Cd_2SnO_4$ film from the second substrate and the CdS layer, depositing a second CdS layer on the second substrate using the CdS layer coating means;

(b) providing a second radio frequency sputter coated substantially amorphous $Cd_2SnO_4$ layer on a first substrate in contact with the second CdS layer in an environment essentially free of water and oxygen;

(c) heating the second $Cd_2SnO_4$ and CdS layers in contact to a treatment temperature sufficient to induce crystallization of the second $Cd_2SnO_4$ layer into a uniform single-phase spinel structure, for a time sufficient to allow full crystallization of the second $Cd_2SnO_4$ layer at the treatment temperature;

(d) cooling the substrates and the crystalline second $Cd_2SnO_4$ layer to room temperature; and (e) separating the crystalline second $Cd_2SnO_4$ layer from the second substrate and second CdS layer.

9. The process of claim 1 wherein said first substrate is selected from the group consisting of silica and glass.

10. The process of claim 1 wherein said second substrate is selected from the group consisting of silica and glass.

11. The process of claim 1 wherein said environment consists essentially of flowing argon.

12. A $Cd_2SnO_4$ film prepared by a process comprising the steps of:

(a) radio frequency sputter coating a substantially amorphous $Cd_2SnO_4$ layer onto a first substrate from a target source having stoichiometric amounts of $SnO_2$ and CdO;

(b) depositing a CdS layer on a second substrate using a CdS layer coating means;

(c) contacting the $Cd_2SnO_4$ layer with the CdS layer in an environment essentially free of water and oxygen;

(d) heating the first and second substrates and the $Cd_2SnO_4$ and CdS layers to a treatment temperature sufficient to induce crystallization of the $Cd_2SnO_4$ layer into a uniform single-phase spinel structure, for a time sufficient to allow full crystallization of the $Cd_2SnO_4$ layer at the treatment temperature;

(e) cooling the first and second substrates to room temperature; and (f) separating the first substrate having the crystallized $Cd_2SnO_4$ film from the second substrate and CdS layer.

13. The film of claim 12 wherein said first substrate and said crystalline $Cd_2SnO_4$ layer are substantially transparent to light between 400 nm and 1000 nm.

14. The film of claim 12 wherein said first substrate is capable of transmitting light between the wavelengths of 350 nm to 1000 nm.

15. The film of claim 12 wherein said first substrate is selected from the group consisting of silica and glass.

16. The sheet of claim 12 wherein said $Cd_2SnO_4$ layer is about 0.5 microns thick.

17. The sheet of claim 12 wherein said crystalline $Cd_2SnO_4$ layer has a sheet resistivity less than about 4 ohm/square.

18. The sheet of claim 12 wherein said crystalline $Cd_2SnO_4$ layer has an average optical transmission greater than about 80 per cent throughout the range of 400 nm to 1000 nm.

19. The sheet of claim 12 wherein said crystalline $Cd_2SnO_4$ layer has a mobility greater than about 50 $cm^2V^{-1}s^{-1}$.

20. The sheet of claim 12 wherein said crystalline $Cd_2SnO_4$ layer has a charge carrier density greater than about $6\times10^{20}$ $cm^{-3}$.

21. The sheet of claim 12 wherein said crystalline $Cd_2SnO_4$ layer has a resistivity less than about $1.8\times10^{-4}$ $\Omega$-cm.

* * * * *